US010014232B2

(12) United States Patent
Wang et al.

(10) Patent No.: US 10,014,232 B2
(45) Date of Patent: Jul. 3, 2018

(54) PACKAGING SHELL AND A POWER MODULE HAVING THE SAME

(71) Applicant: DELTA ELECTRONICS (SHANGHAI) CO., LTD., Pudong, Shanghai (CN)

(72) Inventors: Xianming Wang, Shanghai (CN); Shouyu Hong, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 159 days.

(21) Appl. No.: 14/589,583

(22) Filed: Jan. 5, 2015

(65) Prior Publication Data

US 2015/0216038 A1 Jul. 30, 2015

(30) Foreign Application Priority Data

Jan. 28, 2014 (CN) .......................... 2014 1 0041791

(51) Int. Cl.
*H05K 1/02* (2006.01)
*H05K 5/02* (2006.01)
(Continued)

(52) U.S. Cl.
CPC ............ *H01L 23/04* (2013.01); *H01L 23/562* (2013.01); *H05K 7/1432* (2013.01); *H01L 23/10* (2013.01);
(Continued)

(58) Field of Classification Search
CPC .. H05K 5/0004; H05K 5/0008; H05K 5/0234; H05K 7/1417; H05K 7/142; H05K 7/1432; H01L 23/04; H01L 23/562; H01L 2224/48227; H01L 2224/48091; H01L 23/3735; H01L 23/10; H01L 2924/00014
USPC ........................................................ 257/728
See application file for complete search history.

(56) References Cited

U.S. PATENT DOCUMENTS 6,906,413 B2 * 6/2005 Bish ........................ H01L 23/10
257/706
8,395,254 B2 * 3/2013 Espiritu .............. H01L 23/4334
257/706
(Continued)

FOREIGN PATENT DOCUMENTS

CN 1591850 3/2005
CN 1799141 7/2006
(Continued)

OTHER PUBLICATIONS

Office Action dated Dec. 29, 2015 from corresponding No. TW 103116217.
(Continued)

*Primary Examiner* — Caleen Sullivan
(74) *Attorney, Agent, or Firm* — Hauptman Ham, LLP

(57) ABSTRACT

The present invention provides a packaging shell and a power module having the same. The packaging shell mainly comprises an accommodating recess for receiving a substrate disposed with a plurality of electronic devices/components, so as to make the substrate be further assembled with a heat sink through the support of the packaging shell. Most importantly, in the present invention, the accommodating recess has a stepped surface for contacting with the substrate, and the stepped surface is a curve surface having a flatness difference. By such design, the compressional force generated when assembling the packaging shell, the heat sink and the system circuit board can be uniformly transmitted to substrate via the curve surface structure; such that the compressional force is avoid from being concentrated to a certain point on the substrate, and then the substrate is protected from being ruptured due to the action of the concentrated compressional force.

19 Claims, 17 Drawing Sheets

(51) Int. Cl.
  H05K 5/06    (2006.01)
  H01L 23/04   (2006.01)
  H01L 23/00   (2006.01)
  H05K 7/14        (2006.01)
  H01L 23/10       (2006.01)
  H01L 23/373      (2006.01)

(52) U.S. Cl.
  CPC .............. *H01L 23/3735* (2013.01); *H01L 2224/48091* (2013.01); *H01L 2224/48227* (2013.01); *H05K 1/0203* (2013.01); *H05K 5/069* (2013.01); *H05K 7/142* (2013.01); *H05K 7/1417* (2013.01)

(56) References Cited

U.S. PATENT DOCUMENTS

| | | | |
|---|---|---|---|
| 2002/0149916 A1* | 10/2002 | Kurle | H01R 12/585 361/752 |
| 2003/0035270 A1 | 2/2003 | Shieh et al. | |
| 2008/0111228 A1 | 5/2008 | Yu et al. | |
| 2012/0032341 A1* | 2/2012 | Chao | H01L 21/56 257/774 |
| 2013/0020687 A1 | 1/2013 | Kim et al. | |
| 2014/0197445 A1* | 7/2014 | Saito | H01L 33/642 257/99 |

FOREIGN PATENT DOCUMENTS

| | | |
|---|---|---|
| TW | I229063 | 3/2005 |
| TW | 200733537 | 9/2007 |

OTHER PUBLICATIONS

Office Action dated Feb. 27, 2017 from corresponding application No. CN 201410041791.2.
2nd Office Action dated Oct. 15, 2017 from corresponding application No. CN 2014100417912.
Official Search Report—1st Office Action dated Feb. 27, 2017 from corresponding application No. CN 2014100417912.

* cited by examiner cross-section A-A

PACKAGING SHELL AND A POWER MODULE HAVING THE SAME

BACKGROUND OF THE INVENTION

1. Field of the Invention

The present invention relates to a plastic packaging structure, and more particularly, to a packaging shell and a power module having the same.

2. Description of the Prior Art

High power efficiency and high power density are industrial basic demands on power converters; wherein, high power efficiency implies energy conservation, carbon reduction, environment protection, and low operation cost, and high power density means small volume, light weight, low transportation cost, less space occupation, and low built cost.

Therefore, improving the space utilization inside the power converter is one of key factors to make the power converter achieve high power density and high power efficiency. Besides, semiconductor device is also an important factor for improving the space utilization inside the power converter, and the commonly used way is to dispose a plurality of semiconductor devices on a packaging shell for constructing an integrated power module (IPM).

There are several kinds of packaging technologies for the power module, such as metal packaging, ceramic packaging, plastic packaging, etc. Please refer to FIG. 1, which illustrate a conventional plastic packaging structure. As shown in FIG. 1, a power device 5' is electrically/thermally/mechanically connected with the circuit layer of a substrate 9' such as the DCB (Direct Copper Bonded), the IMS (Insulated Metal Substrate) and the PCB (Printed Circuit Board) through bonding materials such as solder, sintering paste, and silver paste.

In which, the electrodes formed on the top surface of the power device 5' are connected to the substrate 9' via a plurality of aluminum bonding wires 3', and the power device 5' is protected by a silicone gel 7' injected into the shell 1' of the power module. Moreover, a plurality of terminals 4' are assembled on the substrate 9' through bonding materials such as solder for electrically connecting a system circuit board. When assembling the power module, the top surface of the substrate 9' is assembled to the shell 1' using a sealing adhesive 10', and the bottom surface of the substrate 9' is assembled onto a heat sink 8' through a thermal conductive grease 6', and then a plurality of screw bolts 2' are disposed on the assemble hole set in outer side of shell 1' for tightly fixing the shell 1' on the heat sink 8'. By such locking setup, the compressional force applied to the shell 1' by the screw bolts 2' would transform to a compressional force on the substrate 9', such that the substrate 9' would be compressed on the heat sink 8' tightly and tightening the heat-conducting thermal silicone grease 6'. So that, by this way, the power loss generated by devices on the substrate 9' may be highly efficiently transferred to the heat sink 8' through the thermal conductive grease 6', and achieve heat dispassion effect with the packaging.

Thus, through above descriptions, it can be informed that the prior technique is firstly screw the shell 1' to the system circuit board (not shown in FIG. 1), and a compressional force is applied to the shell 1' by the screw bolts 2' for pressing the substrate 9'. By such locking manner, the compressional force applied to the shell 1' by the screw bolts 2' would transform to a compressional force to the substrate 9', such that the substrate 9' would be compressed to the heat sink 8' tightly by pressing and tightening the heat-conducting thermal silicone grease 6'. So, good heat dispassion can be facilitated with the packaging. However, for the fragile substrate 9', such as DCB (Direct Copper Bonded), a crack may happen when the shell 1' is installed by screwing and locking because the fragile substrate 9' cannot afford the stress applied thereof. Accordingly, the conventional plastic packaging technology is necessary to be further improved.

SUMMARY OF THE INVENTION

For overcoming the shortcomings and drawbacks consisted in the conventional plastic packaging technology, the primary objective of the present invention is to provide a packaging shell, wherein the packaging shell mainly comprises an accommodating recess for receiving a substrate disposed with a plurality of electronic devices/components, so as to make the substrate be further assembled with a heat sink through the support of the packaging shell. Most importantly, the accommodating recess has a stepped surface for contacting with the substrate, and the stepped surface is a curve surface having a flatness difference. By such design, the compressional force generated when assembling the packaging shell, the heat sink and the system circuit board can be uniformly transmitted to substrate via the curve surface structure; such that the compressional force is avoid from being concentrated to a certain point on the substrate, and then the substrate is protected from being ruptured due to the action of the concentrated compressional force.

Moreover, another objective of the present invention is to provide a packaging shell having at least one pressure releasing opening disposed between flank parts of the packaging shell and the accommodating recess. Hence, the compressional force generated when tightly fastening the packaging shell by using a few screws would be transferred to the end point of the accommodating recess along the at least one pressure releasing opening and the problem of the stress concentration of the compressional force can be effectively solved, so as to enhance the reliability of installing the packaging shell.

Accordingly, to achieve the primary objective of the present invention, the inventor of the present invention provides a packaging shell for a power module comprising a plurality of electronic components and a substrate, wherein the electronic components are assembled on the substrate; the packaging shell comprising: an accommodating recess providing an accommodating space for the electronic components; a stepped surface surrounding the bottom edge of the accommodating recess for positioning the substrate, wherein the stepped surface has a bigger than normal flatness difference so as to form a curve outline to buffer the stress the substrate subjected during the process of the power module and the packaging shell assembled with another object.

According to one exemplary embodiment of the packaging shell, the flatness difference of the stepped surface ranges from 0.03 mm to 1.0 mm to form the curve outline of the stepped surface.

According to one exemplary embodiment of the packaging shell, the stepped surface is rectangle-shape and is consisted of four sides.

According to one exemplary embodiment of the packaging shell, all the surfaces of the four sides are convex.

According to one exemplary embodiment of the packaging shell, two surfaces of two parallel sides are convex; two surfaces of the other two parallel sides are concave.

According to one exemplary embodiment of the packaging shell, the packaging shell further comprises two flank parts, wherein the two flank parts are extended from the two parallel sides respectively and perpendicular to the accommodating recess.

According to one exemplary embodiment of the packaging shell, each of the flank parts has at least a hole for installation of a heat-sink.

According to one exemplary embodiment of the packaging shell, each of the flank parts has a pressure releasing opening abutting the side the flank part extended from.

According to one exemplary embodiment of the packaging shell, the pressure releasing opening is rectangular, and the length of the pressure releasing opening is parallel to the side the flank part extended from.

According to one exemplary embodiment of the packaging shell, the accommodating recess further comprises a column located at the bottom and pointing to the substrate.

According to one exemplary embodiment of the packaging shell, the accommodating recess further comprises a gel-injection hole at the bottom.

According to one exemplary embodiment of the packaging shell, the substrate is a smiling-like shape and has a warpage within predetermined range.

According to one exemplary embodiment of the packaging shell, the flatness difference of the stepped surface matches with the warpage of the substrate.

According to one exemplary embodiment of the packaging shell, the packaging shell further comprises a plurality of locking holes in the outer surface for locking the packaging shell with a system circuit board.

In addition, to achieve the objective of the present invention, the inventor of the present invention further provides a power module, installed on a system circuit board and connected with a heat-sink at the same time, comprising:

a plurality of electronic components; a substrate, wherein all the electronic components are mounted on the same side of the substrate;

a packaging shell, comprising:
an accommodating recess providing space for the electronic components being assembled with the substrate; and
a stepped surface surrounding the bottom edge of the accommodating recess for positioning the substrate, wherein the stepped surface has a bigger than normal flatness difference so as to form a curve outline to buffer the stress the substrate subjected during the process of the power module and the packaging shell assembled with another object; and
a sealing adhesive, adhering to the stepped surface and the substrate so as to sealing up the substrate and the packaging shell.

According to one exemplary embodiment of the power module, the flatness difference of the stepped surface ranges from 0.03 mm to 1.0 mm to form the curve outline of the stepped surface.

According to one exemplary embodiment of the power module, the stepped surface is rectangle-shaped and consisting four sides.

According to one exemplary embodiment of the power module, the packaging shell further comprises two flank parts, wherein the two flank parts are extended from the two parallel sides respectively and perpendicular to the accommodating recess.

According to one exemplary embodiment of the power module, each of the flank parts has a pressure releasing opening abutting the side the flank part extended from.

According to one exemplary embodiment of the power module, the pressure releasing opening is a rectangular opening, and the length of the pressure releasing opening is parallel to the side the flank part extended from.

According to one exemplary embodiment of the power module, a plurality of locking hole is formed on the outside surface of the packaging shell.

According to one exemplary embodiment of the power module, wherein the substrate is a smiling-like shape and has a warpage within predetermined range.

According to one exemplary embodiment of the power module, the flatness difference of the stepped surface matches with the warpage of the substrate. According to one exemplary embodiment of the power module, the warpage of the substrate ranges from 0.03 mm to 1.0 mm. In summary, compared to the controversial technologies, the present invention has the following advantages:

1. The packaging shell mainly comprises an accommodating recess for receiving a substrate disposed with a plurality of electronic devices/components, so as to make the substrate be further assembled with a heat sink through the support of the packaging shell. Most importantly, the accommodating recess has a stepped surface for contacting with the substrate, and the stepped surface is a curve surface having a flatness difference. By such design, the compressional force generated when assembling the packaging shell, the heat sink and the system circuit board can be uniformly transmitted to substrate via the curve surface structure; such that the compressional force is avoid from being concentrated to a certain point on the substrate, and then the substrate is protected from being ruptured due to the action of the concentrated compressional force.

2. Inheriting to above point 1, moreover, the packaging shell having at least one pressure releasing opening disposed between flank parts of the packaging shell and the accommodating recess. Hence, the action area of a compressional force generated when tightly fastening the packaging shell by using a few screws would expand to the end point of the accommodating recess along the at least one pressure releasing opening and the problem of the stress concentration of the compressional force can be effectively solved, so as to enhance the reliability of installing the packaging shell.

BRIEF DESCRIPTION OF THE DRAWINGS

The present invention will be further explained with reference to the attached drawings, wherein like structures are referred to by like numerals throughout the several views. The drawings shown are not necessarily to scale, with emphasis instead generally being placed upon illustrating the principles of present invention. Further, some features may be exaggerated to show details of particular parts.

DETAILED DESCRIPTION OF THE PREFERRED EMBODIMENTS

Among those benefits and improvements have been disclosed, other objects and advantages of this invention will become apparent from the following description taken in conjunction with the accompanying figures. Detail embodiments of the present invention are disclosed herein; however, it is to be understood that the disclosed embodiments are merely illustrative of the invention that may be embodied in various forms. In addition, each of the examples given in connection with the various embodiments of the invention is intended to be illustrative, and not restrictive.

Throughout the specification and claims, the following terms take the meanings explicitly associated herein, unless the context clearly dictates otherwise. The phrases "In some embodiments" and "in some embodiments" as used herein do not necessarily refer to the same embodiment(s), though it may. Furthermore, the phrases "in another embodiment" and "in some other embodiments" as used herein do not necessarily refer to a different embodiment, although it may. Thus, as described below, various embodiments of the invention may be readily combined, without departing from the scope or spirit of the invention.

As used herein, "flatness difference" is a concept similar with the professional definition of term "flatness difference". "flatness difference" herein means the vertical distance of the lowest point and highest point in one plane. The flatness difference of the stepped surface is big enough to form the curve outline of the stepped surface. The curve outline of the stepped surface may be not found out at the first glimpse. Maybe through the careful observation or making use of precision measurement tools, the curve outline of the stepped surface can be observed. The value of flatness difference ranges from 0.03 mm to 1 mm, which is greater than the normal value of flatness difference smaller than 0.03 mm.

Figure 1:
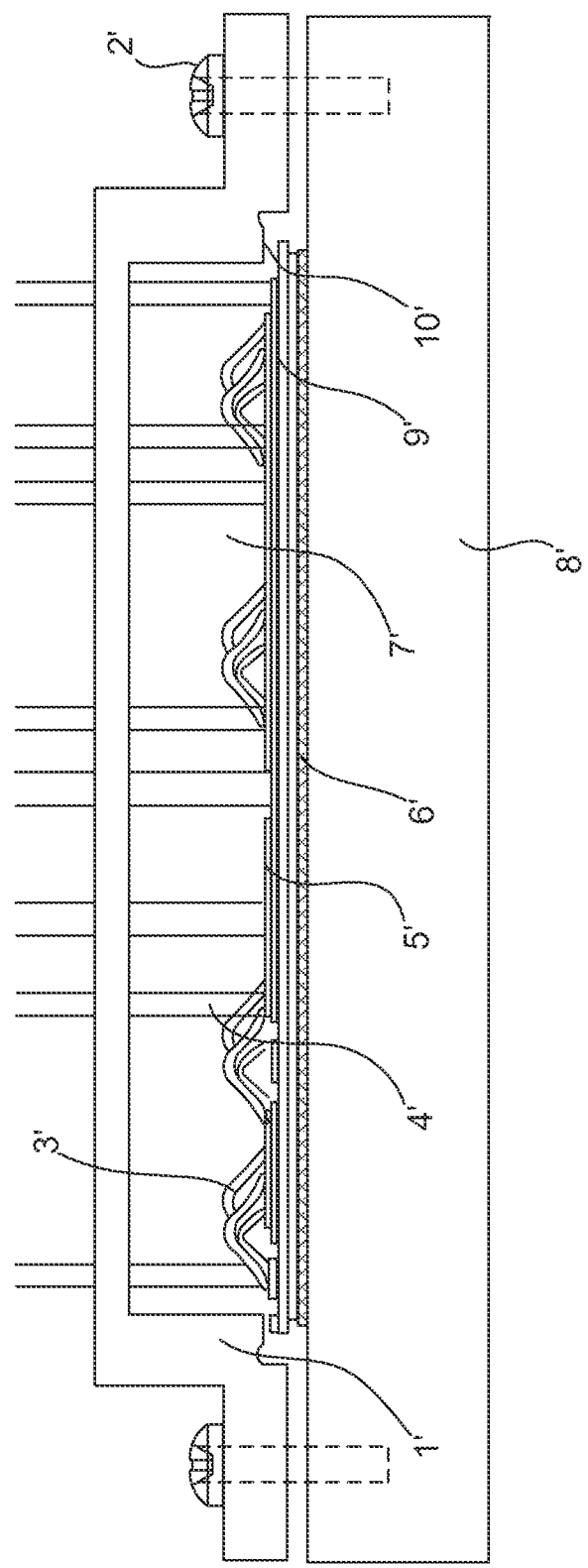
FIG. 1 illustrates a profile section of a packaging module for power device in prior art.
Figure 2A:
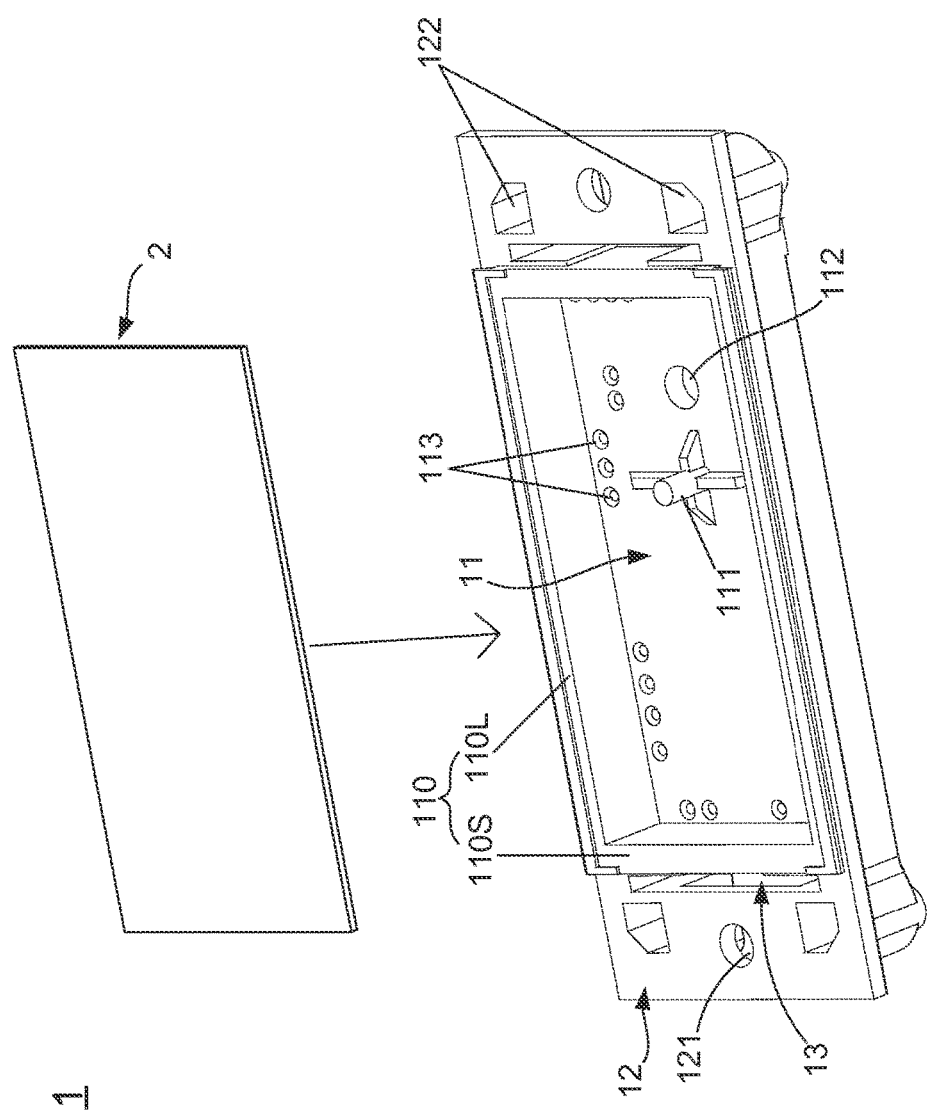
FIG. 2A and FIG. 2B illustrates stereo views of an embodiment of a packaging shell in the present invention.
Figure 2B:
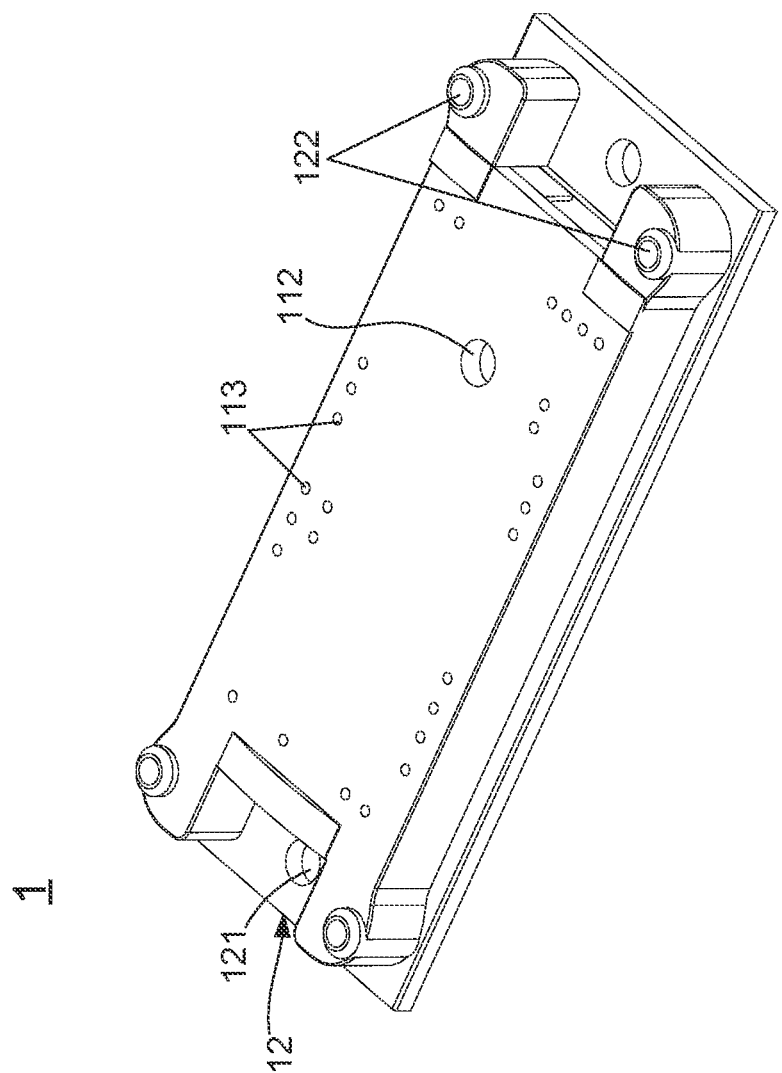
Figure 2C:
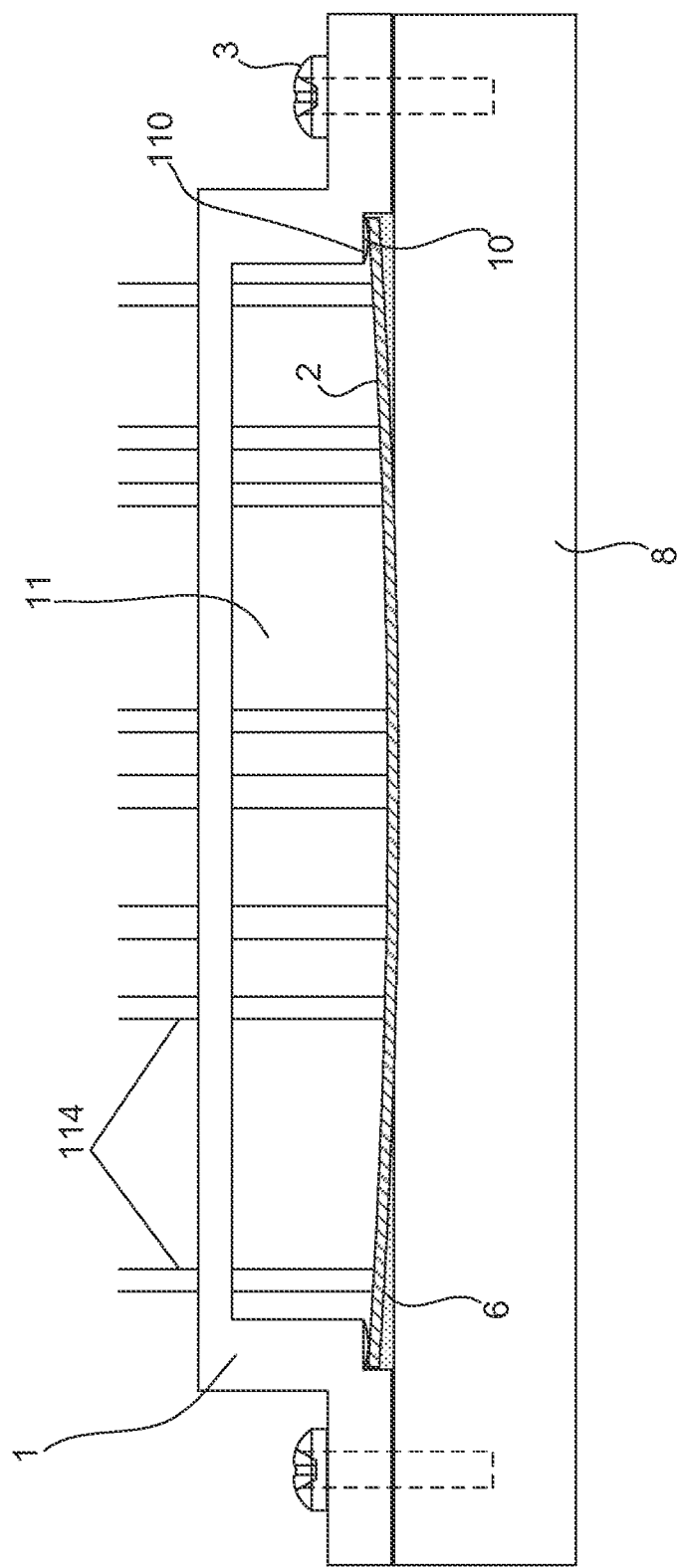
FIG. 2C illustrates a profile section view of an embodiment of a packaging shell in the present invention.

In some embodiments of the instant invention, as shown in FIGS. 2A and 2B, the packaging shell 1 comprises an accommodating recess 11 and a stepped surface 110. Electronic components (not shown in the Figs.) are assembled on a substrate 2. As shown in FIG. 2B, the stepped surface 110 surrounds the bottom edge of the accommodating recess 11. The substrate 2 with electronic components is arranged on the stepped surface 110. The accommodating recess 11 provides an accommodating space for the electronic components on the substrate 2. As shown in FIGS. 2B and 2C, there are many pin holes 113 in accommodating recess 11 for pins 114 of the substrate 2 to pass through. The pins 114 connect the substrate 2 with a system circuit board. And a plurality of locking holes 122 are formed on the outside surface of the packaging shell 1 for fastening the packaging shell 1 onto the system circuit board. As shown in FIGS. 2B and 2C, there are two installing apertures 121 in the packaging shell 1 for installing heat sink 8 with the packaging shell 1 and substrate 2. The substrate 2 is a smiling-like shape and has a warpage within predetermined range. The warpage ranges from 0.03 mm to 1.0 mm.

Figure 3:
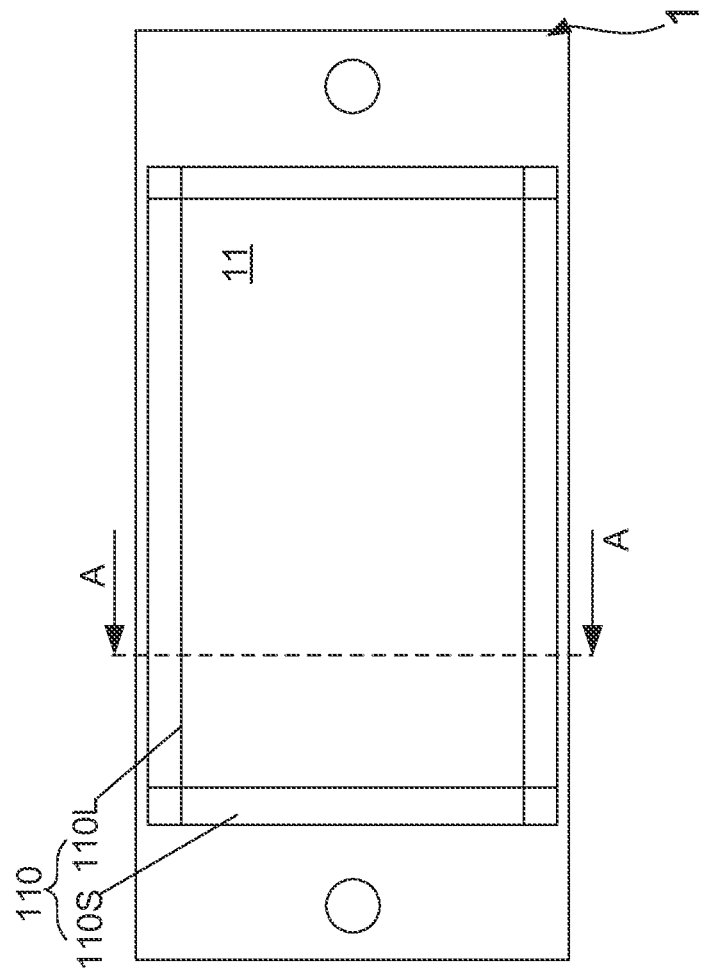
FIG. 3 shows a top view and a cross-sectional view of an embodiment of a packaging shell in the present invention.
Figure 3:
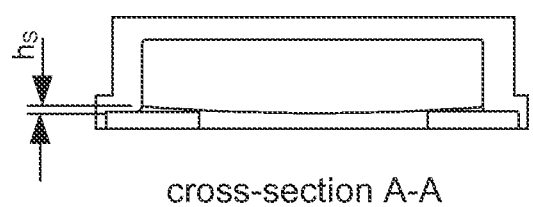
Figure 4:
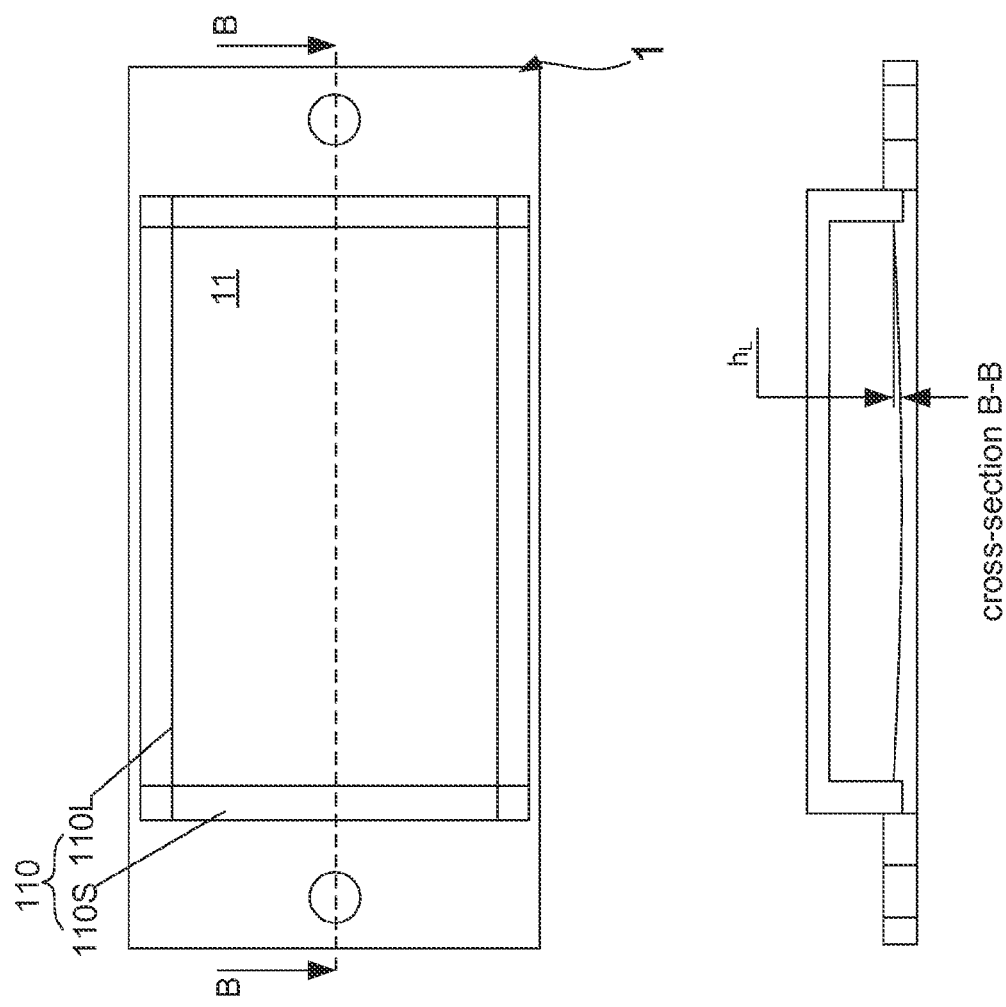
FIG. 4 illustrates certain features of the stepped surface of an embodiment of a packaging shell.
Figure 5A:
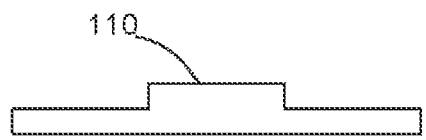
FIG. 5A, FIG. 5B and FIG. 5C illustrates certain features of the stepped surface of some embodiments of a packaging shell in the present invention.
Figure 5B:
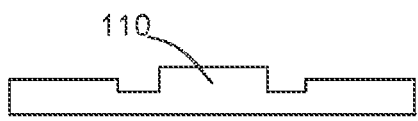
Figure 5C:
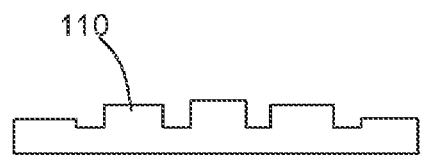
Figure 6B:
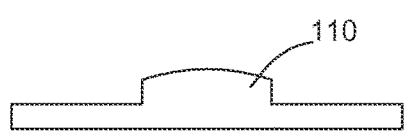
FIG. 6A, FIG. 6B, FIG. 6C, FIG. 6D, FIG. 7A and FIG. 7B illustrates certain features of stepped surface of some embodiments of a packaging shell in the present invention.
Figure 6A:
Figure 6C:
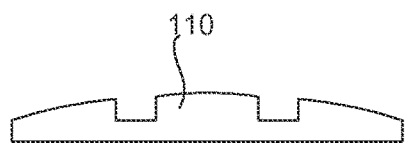
Figure 6D:
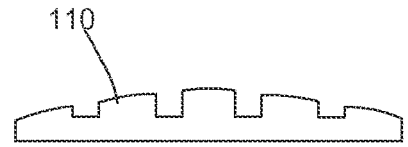
Figure 7B:
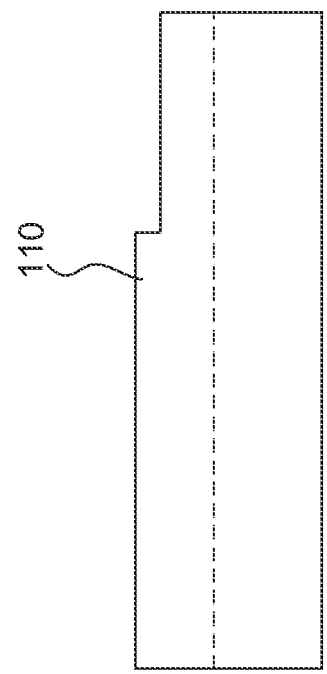
Figure 7A:
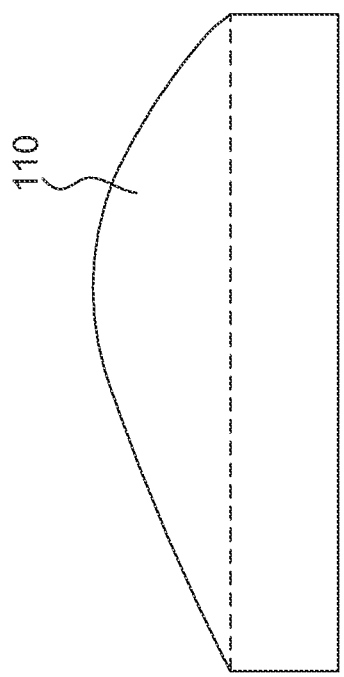

In some embodiments, the packaging shell comprising the stepped surface has the features given in FIGS. 3 and 4. As shown in FIGS. 3 and 4, the stepped surface 110 is a rectangle-shape and is consisted of four sides. In FIG. 3, it shows a left side view of the packaging shell from section line AA. One short side 110S of the stepped surface 110 is convex. And the value of flatness difference of the short side 110S is $h_S$. In one embodiment, if the four sides of the stepped surface are symmetrical configuration, the other short side 110S of the stepped surface is convex as well and the values of flatness difference of the two short sides are equal. In FIG. 4, it also shows a side view from section line BB. And it illustrates one long side 110L of the stepped surface 110 is convex. And the value of flatness difference of the long side 110L is $h_L$. In one embodiment, if the four sides of the stepped surface are symmetrical configuration, the other long side 110L of the stepped surface is convex as well and the values of flatness difference of the two long sides are equal.

Figure 8:
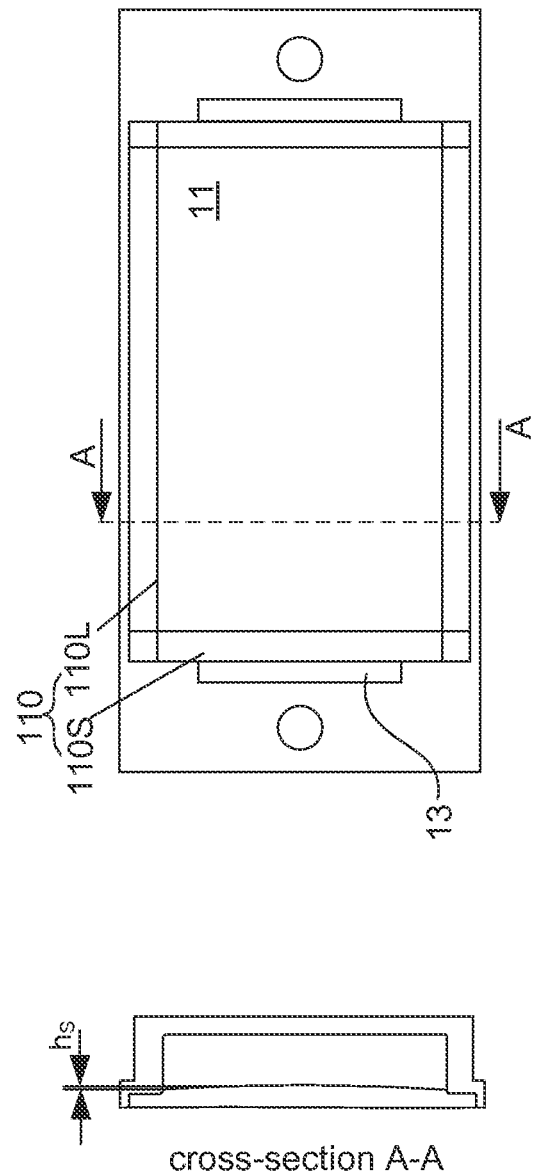
FIG. 8 illustrates certain features of stepped surface of an embodiment of a packaging shell in the present invention.
Figure 9:
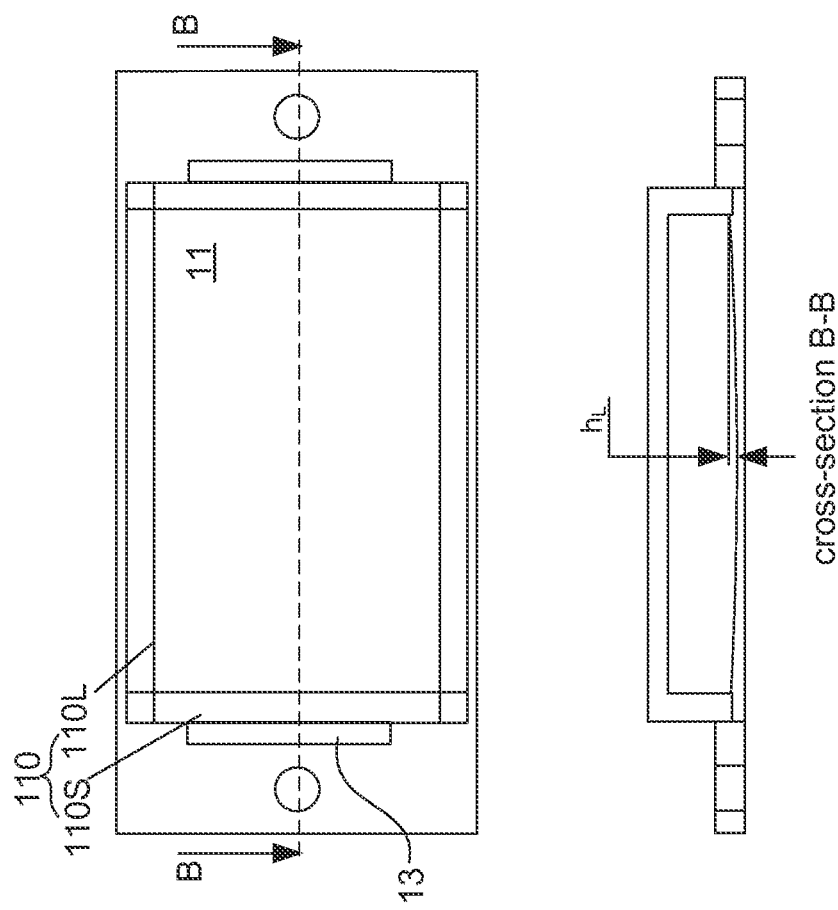
FIG. 9 illustrates certain features of contact face of an embodiment of a packaging shell in the present invention.
Figure 10A:
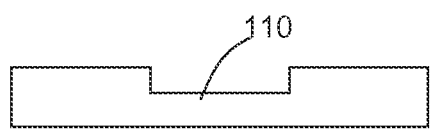
FIG. 10A, FIG. 10B, FIG. 10C, FIG. 11A, FIG. 11B, FIG. 11C, FIG. 12A, FIG. 12B, FIG. 13 and FIG. 14 illustrates certain features of contact face of some embodiments of a packaging shell in the present invention.
Figure 10B:
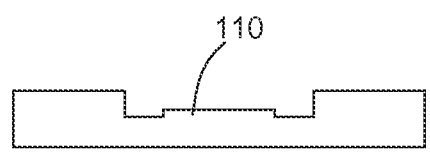
Figure 10C:
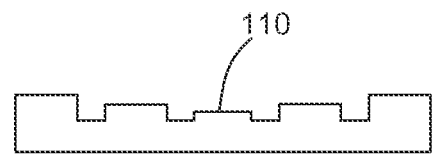
Figure 11A:
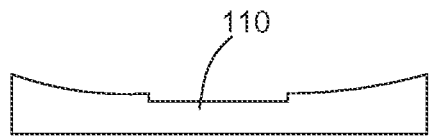
Figure 11B:
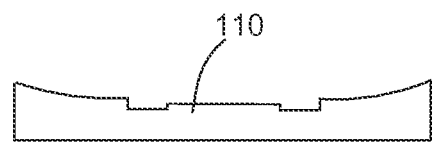
Figure 11C:
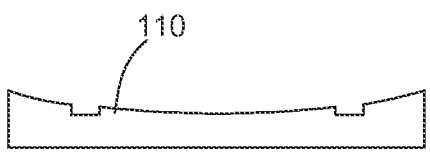
Figure 12B:
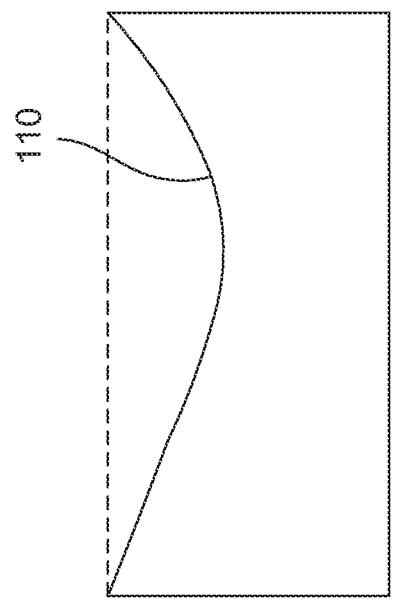
Figure 12A:
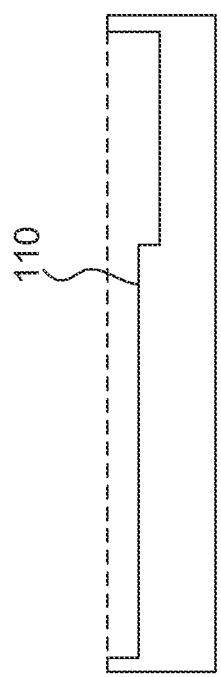

In some embodiments, the stepped surface 110 have features given in FIGS. 8 and 9. In FIG. 8, it shows a left side view of the packaging shell from section line AA. One short side 110S of the stepped surface 110 is concave. And the value of flatness difference of the short side 110S is $h_S$. In FIG. 9, the long side 110L has the same feature shown in FIG. 4. It's not necessary to give a repeat illustration for the feature of the long side 110L of the stepped surface 110.

In some embodiments, the $h_L$ is designed to be slightly greater then $h_S$ for balancing the aforesaid compressional force. Therefore, the relationship of the $h_L$ and the $h_S$ can be represented by the formula of 0.03 mm≤$h_S$≤$h_L$≤1.0 mm. This kind of design for the stepped surface could perfectly match the features as mentioned above about the substrate 2, which is smiling-like shape and has warpage.

As the embodiments of the stepped surface 110 given above, the stepped surface 110 is not a plane in tradition because of bigger flatness difference than the normal flatness difference. Then, the curve outline of the stepped surface 110 can be observed by the careful observation or some precision measurement tools. Since the stepped surface 110 is consisted of four sides in some embodiments, some side of the stepped surface 110 is concave and some side of stepped surface 110 is convex, there are some more embodiments shown about convex side and concave side in FIGS. 5A~7B and FIGS. 10A~14.

Figure 13:
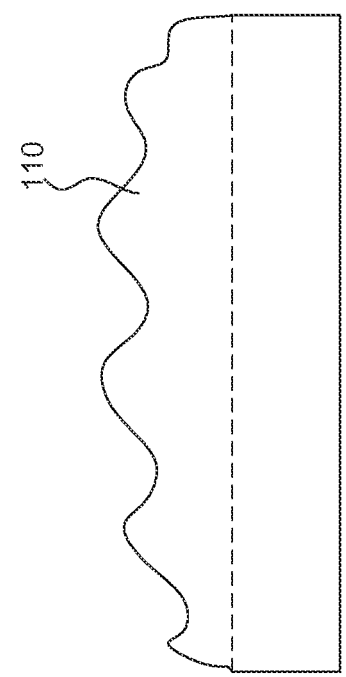

In FIGS. 5A~7B, it shows some embodiments about the cross section of convex sides. In FIG. 13, it also shows one embodiment of the convex side. The features of the convex side are exaggerated to be understood. Since the flatness difference of the convex side is smaller than 1 mm. Then features shown in these figures are not easy observed by naked eyes.

Figure 14:
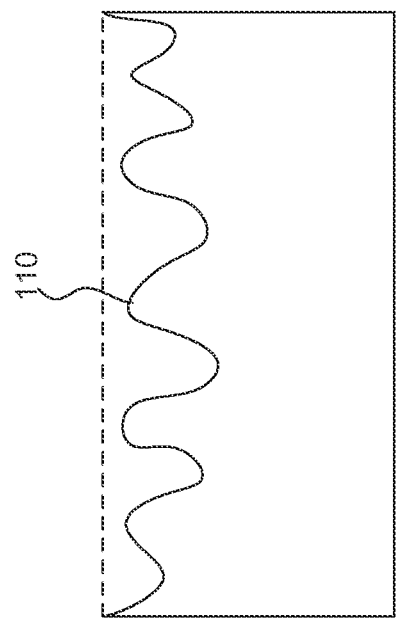

In FIGS. 10A~11C, it shows some embodiments about the cross section of concave sides. In FIG. 14, it also shows one embodiment of the concave side. The features of the concave side are exaggerated to be understood. Since the flatness difference of the concave side is smaller than 1 mm. Then features shown in these figures are not easy observed by naked eyes.

In one embodiment, as shown in FIGS. 2A and 2B, the packaging shell 1 further comprises two flank parts 12, and the two flank parts 12 are extended out from the two parallel sides of the rectangle-shaped stepped surface 110 respectively. The flank parts 12 extends along the long side 110L of the stepped surface 110, and is perpendicular to the stepped surface 110 of the accommodating recess 11. The installing aperture 121 is arranged in the flank part 12.

In one embodiment, as shown in FIGS. 8 and 9, each flank part 12 has a pressure releasing opening 13 abutting the side the flank part 12 extends from. In this embodiment, the pressure releasing opening 13 is rectangular, and the length of the pressure releasing opening 13 is parallel to the side the flank part 12 extended from.

Figure 16:
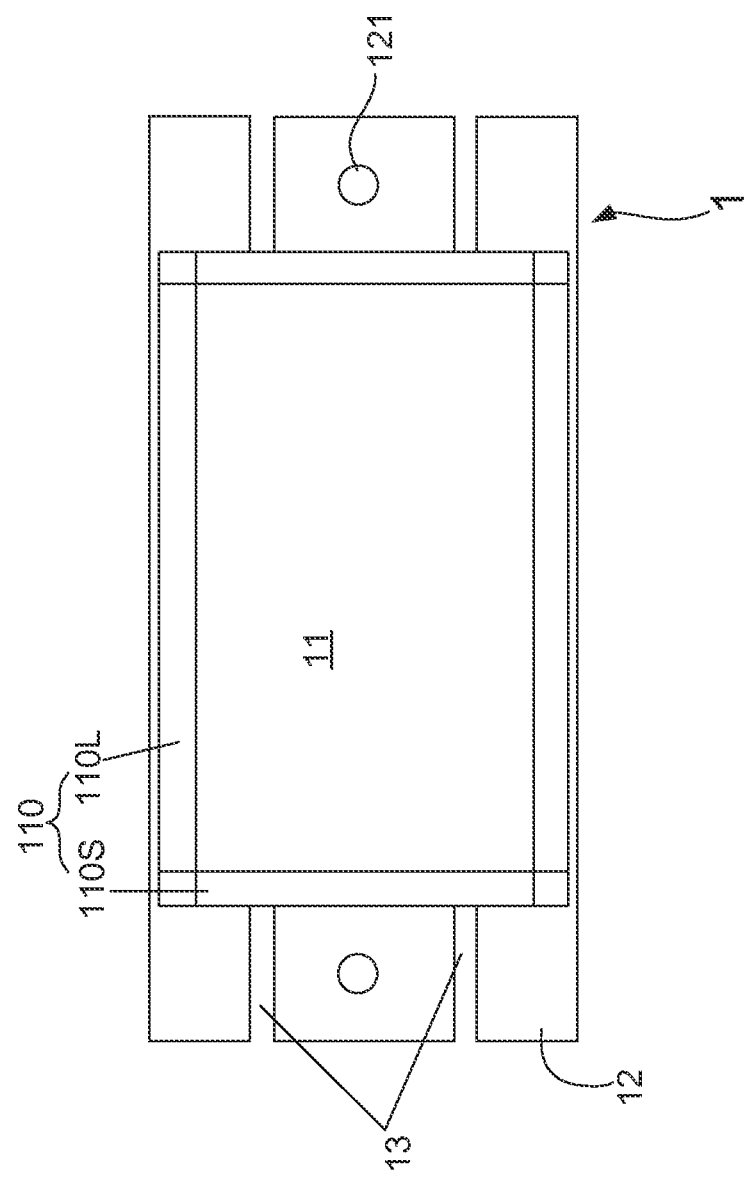
FIG. 16 illustrates certain features of the flank parts of a packaging shell in the present invention.

In some other embodiments, as shown in FIG. 16, each flank part 12 has a pressure releasing openings 13. As shown in the FIG. 16, a plurality of the pressure releasing openings 13 are perpendicular to the side of the stepped surface the flank part 12 extended from. The pressure releasing opening 13 shown in FIG. 16 divides the flank parts 12 into several parts.

Figure 15:
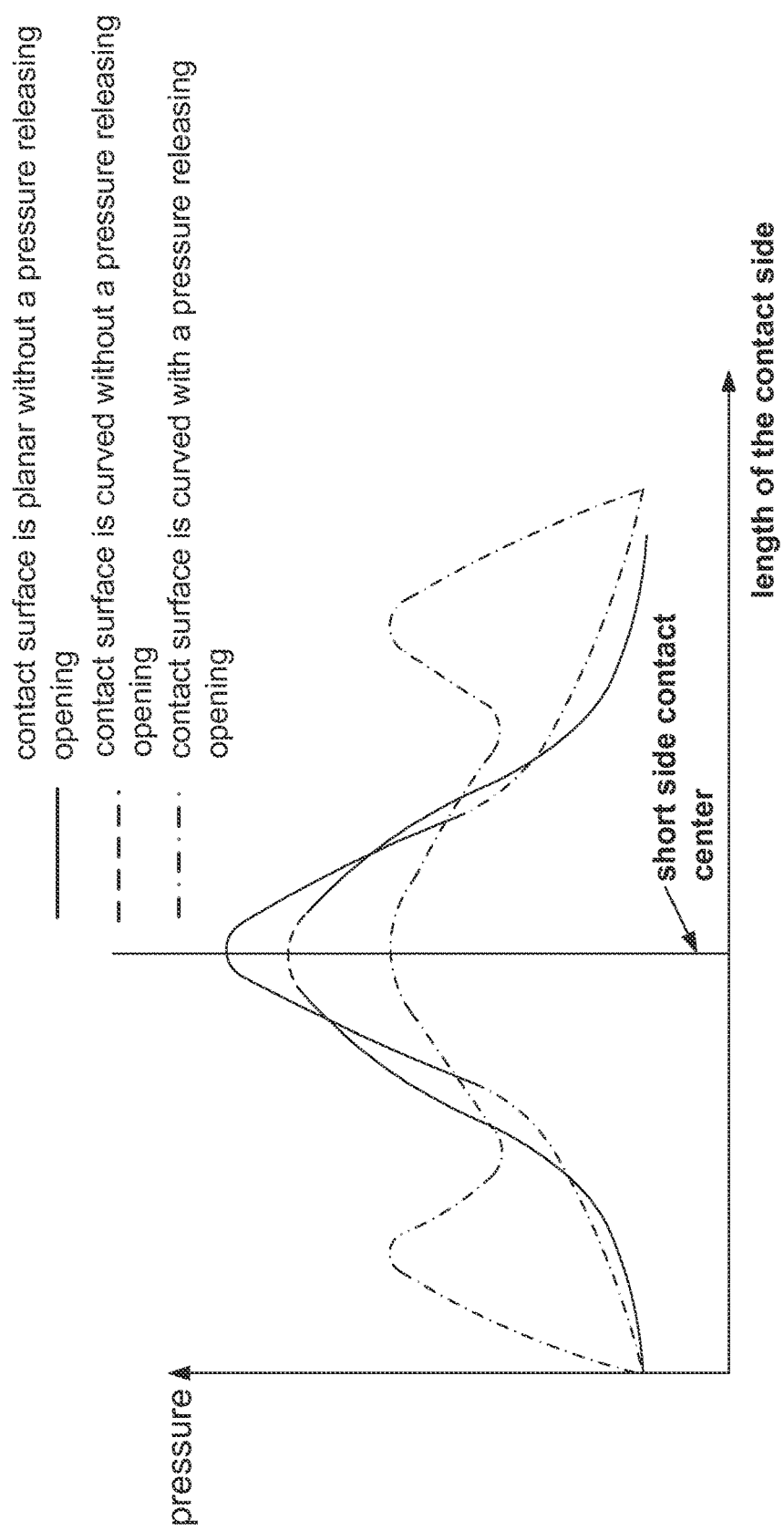
FIG. 15 illustrates pressure test result of some different embodiments of a packaging shell.

All of the pressures releasing openings in the flank parts of the packaging shell are designed to release the pressure the packaging shell suffered and reduce the compressive stress the packaging shell transfers to the substrate. Please refer to the FIG. 15, the comparison of three different samples pressure test result. As shown in FIG. 15, the packaging shell with pressure release opening could get best pressure test result compared to the other two samples.

In some embodiment of a power module, the power module normally comprises a packaging shell and a substrate. The embodiments above illustrate some features about the packaging shell and substrate. As shown in FIG. 2C, in order to ensure the airtightness between the substrate 2 and the packaging shell 1, a seal adhesive 10 is dispensed on the stepped surface 110 for sealing up the substrate 2 and the packaging shell 1. The seal adhesive 10 is gelatinous and flows to the gap or space between the substrate 2 and packaging shell 1 at first when compressing the substrate 2 onto the stepped surface 110. Therefore, the thickness and morphology of the seal adhesive 10 are determined by the shape of the substrate 2 and stepped surface 110. As illustrated above, the stepped surface 110 which has a bigger than normal flatness difference so as to form a curve outline to match with the warpage of the substrate 2 could make the thickness of adhesive 10 more uniform, then this could help to make the stress of the substrate 2 suffered during assembly of the power module more uniform.

In one exemplary embodiment, the substrate could be the DCB (Direct Copper Bonded) which is normally used in the power module. As known for the technician in this art, the DCB substrate is brittle. Thus, the DCB substrate is easily broken during complicate assembly, for instance, assembly of DCB substrate, heat sinks, system circuit board and packaging shell.

In some embodiments, the power module has insulation material encapsulating the electronic components on the substrate. Usually, the insulation material is injected into the sealed space formed between the substrate and packaging shell. Please refer to the FIGS. 2A and 2B, the packaging shell 1 has a gel-injection hole 112 formed on the bottom of the accommodating recess 11. The gel-injection hole 112 is used for the insulation material injection after the substrate 2 assembled with the packaging shell 1. Meanwhile, a column 111 is provided on the bottom of the accommodating recess 11. The column 111 could help to control the thickness of seal adhesive 10.

While a number of embodiments of the present invention have been described, it is understood that these embodiments are illustrative only, and not restrictive, and that many modifications may become apparent to those of ordinary skill in the art.

What is claimed is:

1. A packaging shell for a power module comprising a plurality of electronic components and a substrate, wherein the electronic components are assembled on the substrate; the packaging shell comprising:
   an accommodating recess providing an accommodating space for the electronic components;
   a stepped surface surrounding the bottom edge of the accommodating recess for positioning the substrate, wherein the stepped surface has a bigger than normal flatness difference so as to form a curve outline opposing and contacting with the substrate to buffer the stress the substrate subjected to during the process of the power module and the packaging shell assembled with another object,
   wherein the substrate is a smiling-like shape and has a warpage within a predetermined range, and the flatness difference of the stepped surface matches with the warpage of the substrate.

2. The packaging shell as recited in claim 1, wherein the flatness difference of the stepped surface ranges from 0.03 mm to 1.0 mm to form the curve outline of the stepped surface.

3. The packaging shell as recited in claim 1, wherein the stepped surface is a rectangle-shape and is consisted of four sides.

4. The packaging shell as recited in claim 3, wherein all the surfaces of the four sides are convex.

5. The packaging shell as recited in claim 3, wherein two surfaces of two parallel sides are convex, two surfaces of the other two parallel sides are concave.

6. The packaging shell as recited in claim 1, further comprising two flank parts, wherein the two flank parts are extended from the two parallel sides respectively and perpendicular to the accommodating recess.

7. The packaging shell as recited in claim 6, wherein each of the flank parts has at least a installing aperture for installation of heat-sink.

8. The packaging shell as recited in claim 6, wherein each the flank part has a pressure releasing opening abutting the side the flank part extends from.

9. The packaging shell as recited in claim 8, wherein the pressure releasing opening is rectangular, and the length of the pressure releasing opening is parallel to the side the flank part extends from.

10. The packaging shell as recited in claim 8, wherein the accommodating recess further comprises a column located at the bottom and pointing to the substrate.

11. The packaging shell as recited in claim 8, wherein the accommodating recess further comprises a gel-injection hole at the bottom.

12. The packaging shell as recited in claim 1, wherein the packaging shell further comprises a plurality of locking holes in the outer surface for locking the packaging shell with a system circuit board.

13. A power module, installed on a system circuit board and connected with a heat-sink at the same time, comprising:
   a plurality of electronic components;
   a substrate, wherein all the electronic components are mounted on the same surface of the substrate;
   a packaging shell, comprising:
      an accommodating recess providing space for the electronic components being assembled with the substrate; and
      a stepped surface surrounding the bottom edge of the accommodating recess for positioning the substrate, wherein the stepped surface has a bigger than normal flatness difference so as to form a curve outline opposing and contacting with the substrate to buffer the stress the substrate subjected during the process of the power module and the packaging shell assembled with another object; and a seal adhesive, adhering to the stepped surface and the substrate so as to sealing up the substrate and the packaging shell, wherein the substrate is a smiling-like shape and has a warpage within a predetermined range, and the flatness difference of the stepped surface matches with the warpage of the substrate.

14. The power module as recited in claim 13, the flatness difference of the stepped surface ranges from 0.03 mm to 1.0 mm to form the curve outline of the stepped surface.

15. The power module as recited in claim 13, wherein the stepped surface is rectangle-shaped and is consisted of four sides.

16. The power module as recited in claim 13, the packaging shell further comprising two flank parts, wherein the two flank parts are extended from the two parallel sides respectively and perpendicular to the accommodating recess.

17. The power module as recited in claim 16, wherein each of the flank parts has a pressure releasing opening abutting the side the flank part extends from.

18. The power module as recited in claim 17, wherein the pressure releasing opening is a rectangular opening, and the length of the pressure releasing opening is parallel to the side the flank part extends from.

19. The power module as recited in claim 13, wherein the warpage of the substrate ranges from 0.03 mm to 1.0 mm.

* * * * *